(12) United States Patent
Yamamoto

(10) Patent No.: US 7,096,244 B2
(45) Date of Patent: Aug. 22, 2006

(54) DIGITAL FILTER AND REFERENCE SIGNAL CANCELLING DEVICE AND METHOD USING THE SAME

(75) Inventor: Yuji Yamamoto, Saitama (JP)

(73) Assignee: Pioneer Corporation, Tokyo (JP)

( * ) Notice: Subject to any disclaimer, the term of this patent is extended or adjusted under 35 U.S.C. 154(b) by 873 days.

(21) Appl. No.: 09/822,374

(22) Filed: Apr. 2, 2001

(65) Prior Publication Data

US 2001/0026601 A1 Oct. 4, 2001

(30) Foreign Application Priority Data

Mar. 31, 2000 (JP) ............................. 2000-099766

(51) Int. Cl.
*G06F 17/10* (2006.01)
(52) U.S. Cl. ..................................... 708/320
(58) Field of Classification Search ......... 708/300–323
See application file for complete search history.

(56) References Cited

U.S. PATENT DOCUMENTS

| | | | | |
|---|---|---|---|---|
| 4,467,440 A | * | 8/1984 | Sano et al. | 708/320 |
| 4,521,867 A | * | 6/1985 | Kasuga | 708/320 |
| 4,920,507 A | * | 4/1990 | Takeda | 708/320 |
| 5,392,042 A | * | 2/1995 | Pellon | 708/819 |
| 5,691,929 A | * | 11/1997 | Sun | 708/300 |
| 5,856,934 A | * | 1/1999 | Nakajima et al. | 708/300 |
| 5,963,273 A | * | 10/1999 | Boie et al. | 708/300 |
| 5,995,565 A | * | 11/1999 | Tong et al. | 375/350 |
| 6,445,735 B1 | * | 9/2002 | Whikehart | 708/323 |

OTHER PUBLICATIONS

Richard G. Lyons: "Understanding Digital Signal Processing" 1997, Addison Wesley, p. 242-254, p. 279.
Michael A. Soderstrand: "Design of High-Speed Digital Bandpass Filters without Multipliers" IEEE Proceedings of the International Symposium on Circuits and Systems, vol. 4, No. 25, May 3, 1992 pp. 553-556.
Henry Samueli: A Low-Complexity Multiplierless Half-Band Recursive Digital Filter Design, IEEE Transactions on Acousttics, Speech and Signal Processing, vol. 27, No. 3, Mar. 1, 1989 pp. 442-444.

* cited by examiner

*Primary Examiner*—Kakali Chaki
*Assistant Examiner*—Chat C. Do
(74) *Attorney, Agent, or Firm*—Sughrue Mion, PLLC

(57) ABSTRACT

A second-order bandpass IIR type digital filter, assuming that a sampling frequency is six times as large as a central frequency of a passing frequency band, a first-order input feedback coefficient b1 is set at $-1+2^{-n}$ and a second-order input feedback coefficient b2 is set at $1-2^{-(n-1)}$ (n: an odd number of 3 or larger). In this configuration, second-order IIP type digital filter with a simple arrangement and high accuracy can be provided. In a reference signal canceling apparatus, using such a digital filter, the reference signal can be canceled effectively and completely.

4 Claims, 2 Drawing Sheets

DIGITAL FILTER AND REFERENCE SIGNAL CANCELLING DEVICE AND METHOD USING THE SAME

BACKGROUND OF THE INVENTION

1. Field of the Invention

This invention relates to a second-order IIR type digital filter and a reference signal canceling device and method using it.

2. Description of the Related Art

In FM stereo broadcasting, an FM detected signal includes a pilot signal at a single frequency of 19 KHz which is a reference for stereo demodulation. In order to cancel such a pilot signal, the circuit as shown in FIG. 4 has been proposed. Specifically, the pilot signal is extracted by a bandpass filter 20 which is an IIR (Infinite Impulse Response) filter and supplied to an attenuator 21, thereby canceling the pilot signal.

However, the above IIR filter provides changes in a central frequency and phase characteristic according to the accuracy in the coefficient of the filter. In order to remove the change, the number of bits of the coefficient must be increased. This gave raise to an increase in the circuit size and production cost.

SUMMARY OF THE INVENTION

An object of this invention is to provide a second-order IIR type digital filter with a simple arrangement and high accuracy.

Another object of this invention is to provide a reference signal canceling apparatus using such a digital filter.

In order to attain the above object, in accordance with the first aspect of the this invention, there is provided a second-order bandpass IIR type digital filter, wherein assuming that a sampling frequency is six times as large as a central frequency of a passing frequency band, a first-order input feedback coefficient b1 is set at $-1+2^{-n}$ and a second-order input feedback efficient b2 is set at $1-2^{-(n-1)}$ (n: an odd number of 3 or larger).

In this configuration, the phases at the central frequency at the input and output of the digital filter can be made to agree to each other.

Since the coefficient is set as power of 2, it can be easily acquired with high accuracy.

In a preferred embodiment, a coefficient $a_0$ of an zero-order output is set at $2^{-n}$ ($a_0=2^{-n}$) and a coefficient $a_2$ of a second-order output is set at $-2^{-n}$ ($a_2=-2^{-n}$). Therefore, the amplitudes at the central frequency at the input and output can be made to agree to each other.

In a preferred embodiment, the second-order output is subtracted from the zero-order output and a subtraction result is multiplied by $2^{-n}$. In this configuration, the digital filter can be simplified.

In accordance with the second aspect of this invention, in a reference signal canceling apparatus comprising a filter for extracting a reference signal contained in an FM detected signal and a subtracter for subtracting an output form the filter from the FM detected signal, the above digital filter according to the first aspect of this invention is used as the above filter.

In this configuration, the reference signal (pilot signal) can be removed easily and completely.

In accordance with the third aspect of this invention, a method of canceling the reference signal using the digital filter according to the first aspect is also provided.

The above and other objects and features of the invention will be more apparent from the following description taken in conjunction with the accompanying drawings.

DESCRIPTION OF THE PREFERRED EMBODIMENTS

Prior to explaining an embodiment of this invention, referring to FIG. 3, an explanation will be given of the operating theory of this invention.

Figure 3:
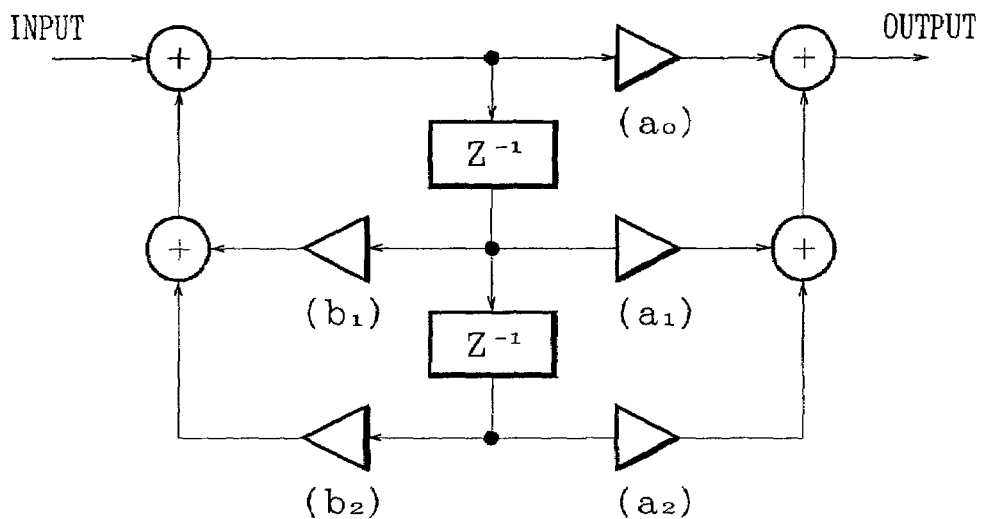
FIG. 3 is a block diagram showing a second-order IIR type digital filer.

FIG. 3 shows the arrangement of a general second-order IIR type digital filter.

In FIG. 3, the transfer function H(Z) of the filter can be expressed by $$H(Z)=(a_0+a_1Z^{-1}+a_2Z^{-2})/(1+b_1Z^{-1}+b_2Z^{-2}) \quad (1)$$

The amplitude characteristic $M(\omega)$ can be expressed by $$M(\omega)=(O/Q)^{0.5} \quad (2)$$

The delay characteristic $\tau(\omega)$ can be expressed by $$\tau(\omega)=(P/O-R/Q)T \quad (3)$$

where $Q=A^2+C^2$ $P=C(C+a_2 \text{ Sin } 2\omega T)-A(A-a_0+a_2 \text{ Cos } 2\omega(T)$ $Q=B^2+D^2$ $R=D(D+b_2 \text{ Sin } 2\omega T)+B(B-1+b_2 \text{ Cos } \omega T)$ $T=\text{sampling time} \quad (4)$ where $A=a_0+a_1 \text{ Cos } \omega T+a_2 \text{ Cos } 2\omega T$ $B=1+b_1 \text{ Cos } \omega T+b_2 \text{ Cos } 2\omega T$ $C=a_1 \text{ Sin } \omega T+a_2 \text{ Sin } 2\omega T$ $D=b_1 \text{ Sin } \omega T+b_2 \text{ Sin } 2\omega T \quad (5)$ In the general form of the second bandpass filter, $a_1=0$ $a_2=-a_2 \quad (6)$ Setting the sampling frequency fs ($=1/T$) at six times as large as the central frequency of the bandpass filter, $$\omega cT=2\pi fcT=\pi/3 \quad (7)$$

$$2\omega cT=2\pi/3 \quad (8)$$

Further $\text{Cos } 2\omega T=-\text{Cos } \omega T \quad (9)$ $\text{Sin } 2\omega T=\text{Sin } \omega T \quad (10)$ $2 \text{ Cos } \omega T=1 \quad (11)$ Assuming that $$a_0=a, a_2=-a \quad (12)$$

in Equation (5), $$A=a+a\cos\omega T$$
$$B=(2+b_1-b_2)\cos\omega T$$
$$C=-a\sin\omega T$$
$$D=(b_1+b_2)\sin\omega T \quad (13)$$

Therefore, in Equation (4), $$O=2a^2(1+\cos\omega T)$$
$$Q=(2+b_1-b_2)^2\cos^2\omega T+(b_1+b_2)^2\sin\omega T$$
$$P=2a^2(\sin^2\omega T-\cos^2\omega T-\cos\omega T)$$
$$R=(b_1+b_2)(b_1+2b_2)\sin^2\omega T+(2+b_1-b_2)(b_1-2b_2)\cos^2\omega T \quad (14)$$

Assuming that $$b_1=-(1-a)$$
$$b_2=1-2a \quad (15)$$
$$b_1+b_2=-a$$
$$b_1+2b_2=1-3a$$
$$2+b_1-b_2=3a$$
$$b_1-2b_2=-3+5a \quad (16)$$

Substituting Equation (16) into Q and R in Equation (14), $$Q=9a\cos\omega T+a\sin^2\omega T$$
$$R=-a(1-3a)\sin^2\omega T+3a(-3+5a)\cos^2\omega T \quad (17)$$

Considering Equation (7), $$\cos^2\omega T=\tfrac{1}{4},\ \sin^2\omega T=\tfrac{3}{4} \quad (18)$$

Therefore, $$O=3a^2$$
$$p=0$$
$$Q=3a^2$$
$$R=3a(2a-1) \quad (19)$$

Thus, substituting Equation (19) into Equation (3), the amplitude characteristic $M(\omega)$ is expressed by $$M(\omega)=(O/Q)^{0.5}1 \quad (20)$$

The delay characteristic $\tau(\omega)$ is expressed by $$\tau(\omega)=(P/O-R/Q)T=(1-2a)/6afc \quad (21)$$

Now, assuming that $$a=2^{-n}(n:\text{integer of 0 or more}) \quad (22)$$

the delay characteristic $\tau(\omega)$ is expressed by $$\tau(\omega)=(2^n-2)/6fc \quad (23)$$

Assuming that $$n=3,5,7,9,\ldots\ldots(n:\text{positive integer other than 1}) \quad (24)$$

$$\tau(\omega)fc=1,5,21,85, \quad (25)$$

Namely, the group delay can be taken as integer times of 1/fc and the phases of the central frequencies at the input and output agree with each other.

Assuming that $$n=2m+1(m:\text{integer of 0 or more}) \quad (26)$$

Equation (23) can be expressed by $$\tau(\omega)=(2^{2m}-1)/3fc \quad (27)$$

Using n in Equation (26), a in Equation (22) can be expressed by $$a=2^{-(2m+1)} \quad (28)$$

Further, $b^1$ and $b^2$ in Equation (15) can be expressed by $$b1=-(1-2^{-(2m+1)})$$
$$b2=1-2^{-2m} \quad (29)$$

The procedure described above can be summarized as follows.

Assuming that 1. the sampling frequency fs is six-times of the central frequency of the bandpass filter, 2. n is an odd number of 3 or greater, 3. $a_0=2^{-n}, a_1=0, a_2=-2^{-n}$ 4. $b_1-(1-2)^{-n}$ and 5. $b_2=1-2^{-(n-1)}$, 6. the amplitude characteristic $M(\omega c)=1$ and 7. the delay characteristic $\tau(\omega c)=(2^n-2)/6fc$.

Otherwise, assuming that

4'. the sampling frequency fs is six-times of the central frequency of the bandpass filter, 2'. m is an integer of m>3, 3'. $a_0=2^{-(2m+1)}, a_1=0, a_2=-2^{-n}$ 4'. $b_1=-(1-2^{-(2m+1)})$ and 5. $b_2=1-2^{-m}$, 6. the amplitude characteristic $M(\omega c)=1$ and 7. the delay characteristic $\tau(\omega c)=(2^{2m}-1)/3fc$. $\quad (31)$ Therefore, the phases and amplitudes at the central frequency at the input and output agree to each other.

Further, $a_0=2^{-(2m+1)}$, the coefficient can be calculated by "bit shift", thus facilitating the operation. In addition, because of no coefficient error, the operation can be carried with high accuracy.

The band of the filter becomes narrow as $a_0$ approaches 0. For this reason, the objective bandwidth can be acquired by selecting $a_0$ according to the object.

Figure 1:
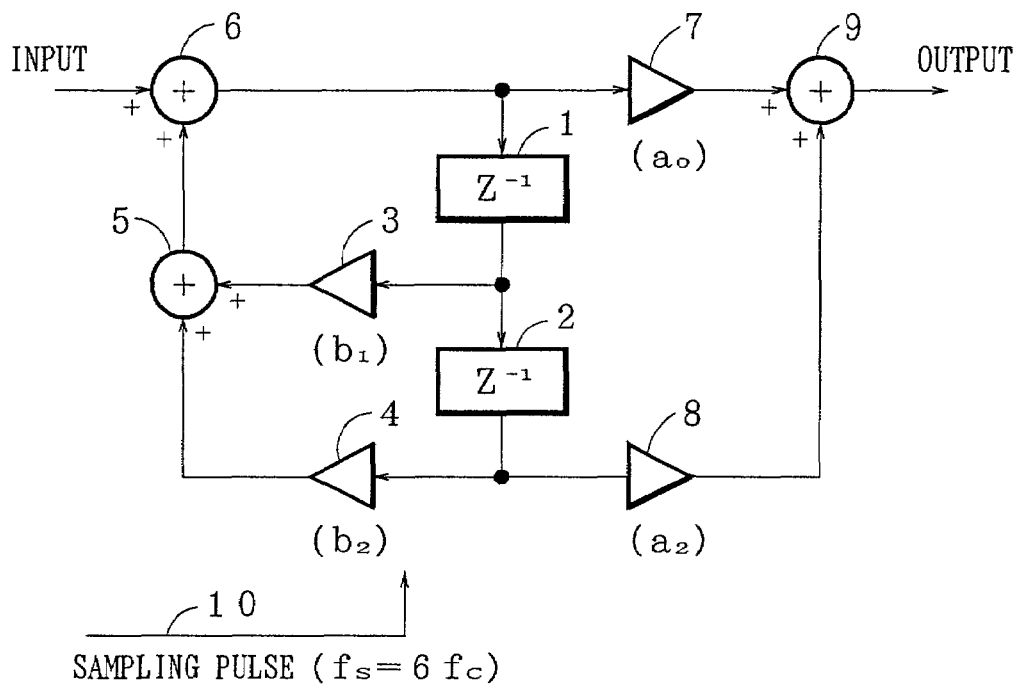
FIG. 1 is a block diagram showing the first embodiment of this invention.

Now referring to FIG. 1, an explanation will be given of a first embodiment of this invention. FIG. 1 is an arrangement view of the first embodiment.

In FIG. 1, reference numerals 1 and 2 denote a delay operator, 3 a first-order input feedback coefficient ($b_1$), 4 a second-order input feedback coefficient ($b_2$) 5 and 6 are an adder, respectively, 7 a zero-order output coefficient ($a_0$) 8 a second-order output coefficient, 9 an adder and 10 a sampling pulse for processing digital signal processing.

The frequency fs of the sampling pulse is set at six times of the central frequency fc of the bandpass filter as expressed by Equation (30). Assuming that n is an odd number of 3 or more, the first-order input feedback coefficient ($b_1$) 3 is set at $-(1-2^{-n})$ and the second-order input feedback coefficient ($b_2$) 4 is set at $1-2^{-(n-1)}$.

The zero-order output coefficient ($a_0$) 7 is set at $2^{-n}$ and the second-order output coefficient ($a_2$) 8 is set at $-2^{-n}$.

In the operation with the above settings, at the input and output of the filter, the phase and amplitude can be caused to agree to each other.

Since the coefficient is set as power of 2, it can be easily acquired with high accuracy.

Figure 2:
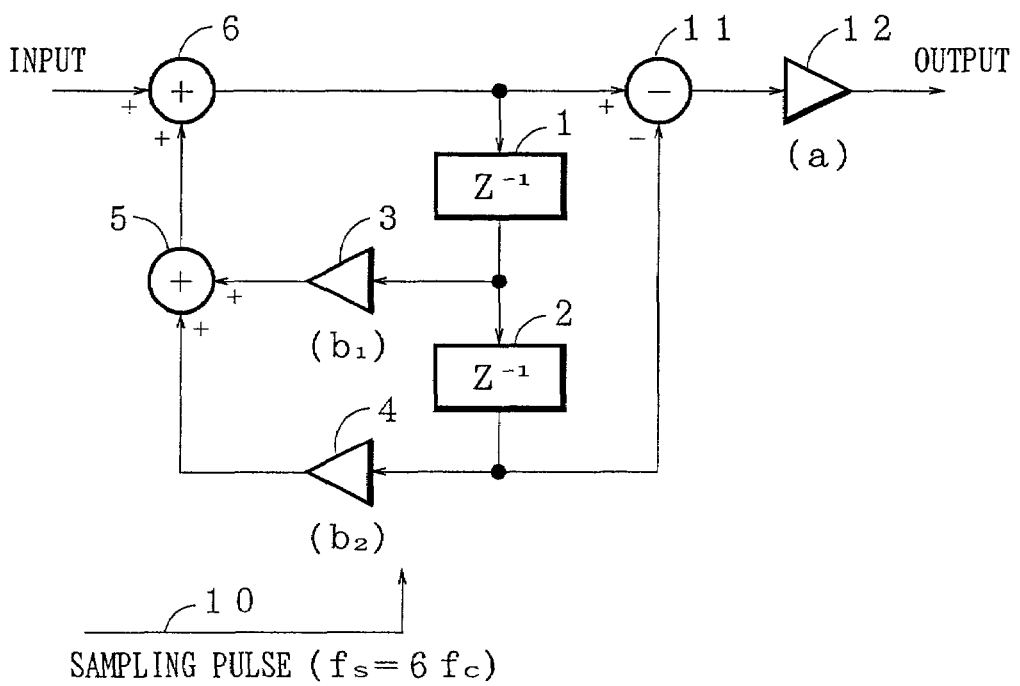
FIG. 2 is a block diagram showing the second embodiment of this invention.

Now referring to FIG. 2, an explanation will be given of a second embodiment of this invention. FIG. 2 is an arrangement view of the first embodiment.

In the first embodiment, the zero-order output coefficient ($a_0$) 7 was set at $2^{-n}$ ($a_0=2^{-n}$) and the second-order output coefficient ($a_2$) was set at $-2^{-n}$ ($a_2=-2^{-n}$).

Specifically, $a_0=-a_2$. The zero-order output was multiplied by $a_0$, and the second-order output was multiplied by $-a_2$. The outputs thus acquired were added to acquire an output signal.

The second embodiment intends to reduce the number of multiplication.

Specifically, as seen from FIG. 2, in a subtracter 11, the second-order output is reduced from the zero-order output, and the output from the subtracter 11 is multiplied by a coefficient ($a=2^{-n}$) 12.

Figure 4:
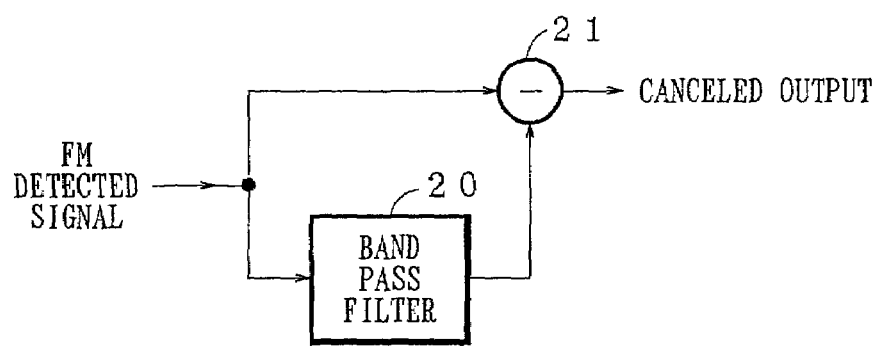
FIG. 4 is a block diagram showing a conventional pilot signal canceling apparatus.

A reference signal canceling apparatus according to this invention can be constructed using the second-order IIR digital filter hitherto explained. Specifically, in the second-order IIR digital filter, the central frequency is set at 19 KHz of the pilot signal and the sampling frequency is set at six times as large as this frequency. The digital filter with such settings is substituted for the bandpass filter in the pilot signal canceling apparatus described with reference to FIG. 4. Thus, the phase and amplitude of the pilot signal at the output can be made equal to those at the input. The difference in these phase and amplitude between the input and output can be taken in the subtracter 21 so that the pilot signal can be completely canceled from the FM detected signal. Any configuration can be adopted as long as the reference signal at a single frequency contained in a prescribed signal can be canceled.

Further, for example, in an RDS broadcasting, a reference signal at 57 KHz is superposed on a detected signal for data demodulation. In this case, by setting the sampling frequency at six times as large as 57 KHz, the reference signal at 57 KHz can be easily canceled.

What is claimed is:

1. A reference signal canceling apparatus comprising:
   a filter for extracting a reference signal; and
   a subtractor for subtracting an output from said filter from said reference signal,
   wherein said filter is constructed as a second-order bandpass Infinite Impulse Response (IIR) type digital filter with a transfer function H(Z) expressed by $$H(Z) = \frac{(a_0 + a_2 Z^{-2})}{(1 + b_1 Z^{-1} + b_2 Z^{-2})};$$

a first-order input feedback coefficient $b_1$ set at $-1+2^{-n}$; and
   a second-order input feedback coefficient $b_2$ set at $1-2^{-(n-1)}$, where n is an odd number of 3 or larger,
   wherein a zero-order output coefficient $a_0$ is set at $2^{-n}$ ($a_0=2^{-n}$) and a coefficient $a_2$ of a second-order output is set at $-2^{-n}$ ($a_2=-2^{-n}$), and
   wherein the first-order input feedback coefficient $b_1$ and the second-order input feedback coefficient $b_2$ are set when a sampling pulse, for processing digital signal processing, is set to a frequency six times as large as a central frequency of a passing frequency band of the second-order bandpass IIR digital filter.

2. A reference signal canceling apparatus comprising:
   a filter for extracting a reference signal; and
   a subtractor for subtracting an output from said filter from said reference signal,
   wherein said filter is constructed as a second-order bandpass Infinite Impulse Response (IIR) type digital filter with a transfer function H(Z) expressed by $$H(Z) = \frac{a(1 - Z^{-2})}{(1 + b_1 Z^{-1} + b_2 Z^{-2})},$$

a first-order input feedback coefficient $b_1$ set at $-1+2^{-n}$; and
   a second-order input feedback coefficient $b_2$ set at $1-2^{-(n-1)}$, where n is an odd number of 3 or larger,
   wherein a second-order output is subtracted from a zero-order output and the subtraction result is multiplied by a ($a=2^{-n}$), and
   wherein the first-order input feedback coefficient $b_1$ and the second-order input feedback coefficient $b_2$ are set when a sampling pulse, for processing digital signal processing, is set to a frequency six times as large as a central frequency of a passing frequency band of the second-order bandpass IIR digital filter.

3. A reference signal canceling apparatus comprising:
   a filter for extracting a reference signal contained in a frequency modulation (FM) detected signal; and
   a subtracter for subtracting an output from the filter from said FM detected signal,
   wherein said filter is constructed as a second-order bandpass Infinite Impulse Response (IIR) type digital filter with a transfer function H(Z) expressed by $$H(Z) = \frac{(a_0 + a_1 Z^{-1} + a_2 Z^{-2})}{(1 + b_1 Z^{-1} + b_2 Z^{-2})},$$

and when a sampling pulse for processing digital signal processing is set to a frequency is six times as large as a central frequency of a passing frequency band of the second-order bandpass IIR digital filter, a first-order input feedback coefficient $b_1$ is set at $-1+2^{-n}$ and a second-order input feedback coefficient $b_2$ is set at $1-2^{-(n-1)}$, where n is an odd number of 3 or larger, and $a_0$, $a_1$, and $a_2$ are output coefficients having real values.

4. A method of canceling a reference signal in a reference signal canceling apparatus having a filter for extracting a reference signal contained in a frequency modulation (FM) detected signal and a subtracter for subtracting an output from the filter from said FM detected signal, said method comprising:

constructing said filter as a second-order bandpass Infinite Impulse Response (IIR) type digital filter with a transfer function $$H(Z) = \frac{(a_0 + a_1 Z^{-1} + a_2 Z^{-2})}{(1 + b_1 Z^{-1} + b_2 Z^{-2})};$$

setting a first-order input feedback coefficient $b_1$ at $-1+2^{-n}$; and setting a second-order input feedback coefficient $b_2$ at $1-2^{-(n-1)}$, where n is an odd number of 3 or larger, and $a_0$, $a_1$, and $a_2$ are output coefficients having real values, wherein the first-order input feedback coefficient and the second-order input feedback coefficient are set when a sampling pulse, for processing digital signal processing, is set to a frequency six times as large as a central frequency of a passing frequency band of the second-order bandpass IIR digital filter.

* * * * *